(12) United States Patent
Oohasi et al.

(10) Patent No.: US 7,680,612 B2
(45) Date of Patent: Mar. 16, 2010

(54) VEHICLE POWER SUPPLY DEVICE

(75) Inventors: Tosihiko Oohasi, Osaka (JP); Yohsuke Mitani, Osaka (JP)

(73) Assignee: Panasonic Corporation, Osaka (JP)

( * ) Notice: Subject to any disclaimer, the term of this patent is extended or adjusted under 35 U.S.C. 154(b) by 265 days.

(21) Appl. No.: 11/916,691

(22) PCT Filed: Jul. 26, 2006

(86) PCT No.: PCT/JP2006/314718

§ 371 (c)(1),
(2), (4) Date: Dec. 6, 2007

(87) PCT Pub. No.: WO2007/013481

PCT Pub. Date: Feb. 1, 2007

(65) Prior Publication Data

US 2009/0119034 A1  May 7, 2009

(30) Foreign Application Priority Data

Jul. 26, 2005  (JP) .............................. 2005-215352

(51) Int. Cl.
*G01R 31/36* (2006.01)

(52) U.S. Cl. ........................... 702/57; 702/63; 320/150; 320/137; 324/430; 324/765

(58) Field of Classification Search .................. 702/57, 702/63; 320/150, 137; 324/430, 765
See application file for complete search history.

(56) References Cited

U.S. PATENT DOCUMENTS

| 6,788,027 B2 * | 9/2004 | Malik .......................... 320/134 |
| 2002/0085397 A1 * | 7/2002 | Suzui et al. .................... 363/37 |

FOREIGN PATENT DOCUMENTS

| JP | 08-214402 | 8/1996 |
| JP | 2004-303756 A | 10/2004 |
| JP | 2005-28908 | 2/2005 |
| JP | 2005-189080 | 7/2005 |

OTHER PUBLICATIONS

International Search Report Dated Aug. 29, 2006.

* cited by examiner

*Primary Examiner*—Eliseo Ramos Feliciano
*Assistant Examiner*—Janet L Suglo
(74) *Attorney, Agent, or Firm*—Pearne & Gordon LLP (57) ABSTRACT

A vehicle power supply device performs highly accurate determination of degradation of the capacitor unit as follows. Internal resistance and capacitance are corrected according to the temperature of capacitor unit during charge or discharge, thereby obtaining a corrected calculated value if capacitance. The corrected calculated value of capacitance is substituted into a degradation determination formula, which is pre-calculated according to the temperature, thereby calculating the standard value corresponding to the temperature detected by temperature sensor. When the standard value is equal to or less than the corrected calculated value of internal resistance, capacitor unit is determined to be degraded.

7 Claims, 7 Drawing Sheets

PRIOR ART

VEHICLE POWER SUPPLY DEVICE

This application is a U.S. national phase application of PCT International Application PCT/JP2006/314718

TECHNICAL FIELD

The present invention relates to emergency power supplies for electronic devices operated by battery or other power source. More specifically, the present invention relates to a vehicle power supply device that is used, for example, in an electronic brake system for electrically braking a vehicle.

BACKGROUND ART

In recent years, hybrid and electric vehicles have been rapidly developed. In line with this, various suggestions have been made to change the braking system of vehicles from the conventional mechanical hydraulic control to electrohydraulic control.

The electrohydraulic control of vehicles is generally performed using a battery-operated power supply. Therefore, if the power supply from the battery is cut off for some reason, the hydraulic control is shut off, possibly making it impossible to brake the vehicles. To prepare for such an emergency, various vehicle power supply devices have been proposed which include high-capacity capacitors or the like as an auxiliary power supply besides the battery.

Since vehicle power supply devices involve the vehicle braking in an emergency, it is crucial for them to ensure the provision of electricity in an emergency by accurately determining degradation of capacitors, which are their key devices.

In an attempt to achieve this, a conventional vehicle power supply device determines degradation of the capacitors as follows. First, the vehicle power supply device obtains the internal resistance value and the capacitance value of a capacitor unit including a plurality of capacitors. Then, the device makes the temperature sensor disposed near the capacitor unit detect the temperature. Next, the device corrects the internal resistance value and the capacitance value based on the detected temperature. Finally, the device compares these corrected values with the degradation standard value data corresponding to the detected temperature so as to determine the degradation. More specifically, the internal resistance value of the capacitor unit is correlated with the inverse of the capacitance value when sufficient electricity is supplied to the load; however, the correlation changes when the capacitor unit is degraded. This fact is taken advantage of to determine the degradation of the vehicle power supply device as follows. The relation between the internal resistance value and the capacitance value when the capacitor unit is degraded is previously stored in association with each temperature in a ROM connected to a controller (microcomputer). The device is determined to be degraded when the internal resistance value corresponding to the capacitance value that is corrected based on the current temperature reaches the stored degradation standard value of the internal resistance value.

Figure 7:
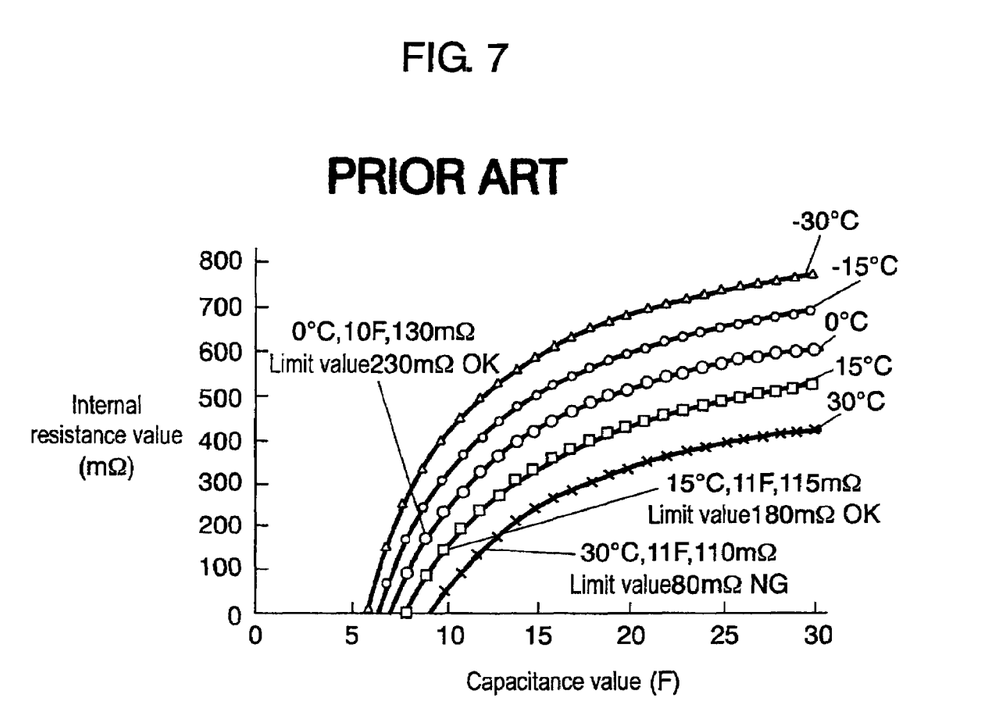
FIG. 7 is a correlation graph between the capacitance and the degradation standard value of the internal resistance of the capacitor unit of a conventional vehicle power supply device, using degradation determination formulas corresponding to different temperatures.

FIG. 7 is a correlation graph between a capacitance value and the degradation standard value of an internal resistance value of the capacitor unit of a conventional vehicle power supply device, using degradation determination formulas corresponding to different temperatures. In other words, the correlation graph shows an example of the degradation standard value data of the internal resistance value corresponding to the capacitance value. In FIG. 7, horizontal axis represents the capacitance, and the vertical axis represents the internal resistance. The correlation between them differs depending on the temperature and is shown at temperatures at 15° C. intervals between −30° C. and 30° C.

When the capacitor unit has a temperature of 0° C., a capacitance of 10 F and an internal resistance of 130 mO, the degradation standard value (limit value) is 230 mO as shown by the circle plot (0° C.) of FIG. 7. Since the current internal resistance (130 mO) has not reached the standard value, the capacitor unit is determined not to be degraded yet.

When the capacitor unit is at 15° C., 11 F and 115 mO, the degradation standard value (limit value) is 180 mO as shown by the square plot (15° C.) of FIG. 7. Since the current internal resistance (115 mO) has not reached the standard value, the capacitor unit is determined not to be degraded yet.

On the other hand, when the capacitor unit is at 30° C., 11 F and 110 mO, the degradation standard value (limit value) is 80 mO as shown by the "X" plot (30° C.) of FIG. 7. Since the current internal resistance (110 mO) has exceeded the standard value, the capacitor unit is determined to be degraded.

One of the prior arts related to the present application is disclosed in Japanese Patent Unexamined Publication No. 2005-28908.

It is understood, as described above, that the conventional vehicle power supply device can determine degradation of the capacitor unit and that the determination is accurate because it is performed with respect to each temperature.

However, the degradation standard value data that can be stored in the ROM is limited to the amount corresponding to the plots shown in FIG. 7 due to the storage capacity of the ROM. Therefore, when the plot corresponding to the temperature exists, the degradation can be determined with high accuracy. On the other hand, when the plot corresponding to the temperature does not exist, the capacitance value on the plot corresponding to the closest temperature is used. Since this is not the accurate degradation standard value, the degradation cannot be determined with sufficient accuracy when the plot corresponding to the temperature does not exist.

SUMMARY OF THE INVENTION

The vehicle power supply device of the present invention determines degradation of the capacitor unit as follows. The relation between the capacitance value and the internal resistance value when the capacitor unit is degraded is defined as a degradation determination formula. The capacitance value of the capacitor unit is substituted into the degradation determination formula to give the standard value. When the standard value is equal to or less than the internal resistance value of the capacitor unit, the capacitor unit is determined to be degraded.

This structure makes it possible to calculate the degradation standard value using the degradation determination formula, thereby providing highly accurate determination of degradation.

REFERENCE MARKS IN THE DRAWINGS

| | |
|---|---|
| 3 | vehicle power supply device |
| 11 | capacitor unit |
| 13 | charge circuit |
| 14 | discharge circuit |
| 15 | microcomputer (controller) |
| 16 | switch |
| 17a | capacitor-unit voltage detector |
| 17b | capacitor-unit current detector |
| 18 | temperature sensor |

DETAILED DESCRIPTION OF PREFERRED EMBODIMENT

The best mode of the present invention is described as follows with reference to drawings.

Embodiment

Figure 1:
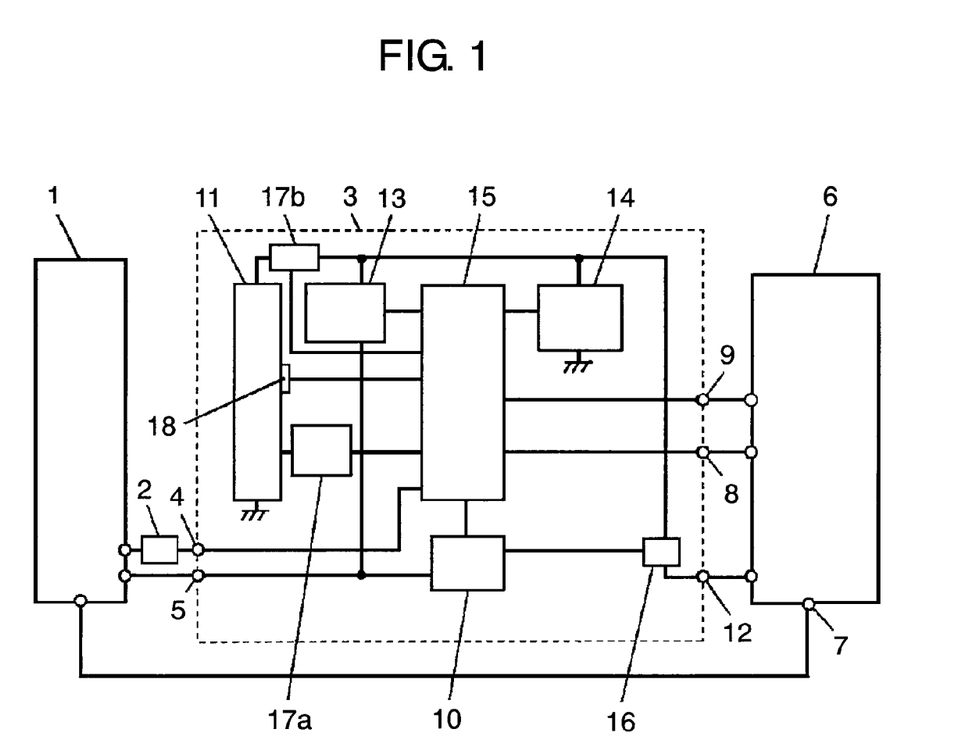
FIG. 1 is a block circuit diagram of a vehicle power supply device according to an embodiment of the present invention.

FIG. 1 is a block circuit diagram of a vehicle power supply device according to an embodiment of the present invention. In FIG. 1, battery 1 is connected to IG (ignition generator) terminal 4 in vehicle power supply device 3 via ignition switch 2, which is operated to start or stop the operation of the vehicle. Battery 1 is also connected to +BC terminal 5, which is provided to supply power to vehicle power supply device 3, and power-supply terminal 7, which is provided in electronic controller 6.

Vehicle power supply device 3 and electronic controller 6 are connected to each other via communication input terminal 8, communication output terminal 9, and OUT terminal 12. Communication input terminal 8 is used when vehicle power supply device 3 receives a signal from electronic controller 6. Communication output terminal 9 is used when vehicle power supply device 3 outputs a signal to electronic controller 6. OUT terminal 12 is used when vehicle power supply device 3 outputs auxiliary power charged in capacitor unit 11 provided therein including a plurality of capacitors when battery voltage detector 10 detects an abnormal voltage of battery 1.

The following is a description of the structure of vehicle power supply device 3.

Vehicle power supply device 3 includes capacitor unit 11 as an auxiliary power supply to supply power to electronic controller 6, which brakes the vehicle under abnormal conditions of battery 1. Capacitor unit 11 is composed, for example, of a plurality of electric double layer capacitors capable of rapid charge-discharge. Vehicle power supply device 3 further includes charge circuit 13 and discharge circuit 14 to charge and discharge, respectively, capacitor unit 11. These circuits are controlled in accordance with the instructions from microcomputer 15, which is a controller. Charge circuit 13 includes a constant current controller, which keeps a voltage rise in capacitor unit 11 during charge as constant as possible.

Battery voltage detector 10 is provided with switch 16 formed of a FET. Switch 16 supplies auxiliary power from capacitor unit 11 to electronic controller 6 via OUT terminal 12 when an abnormal voltage of battery 1 is detected.

Vehicle power supply device 3 further includes capacitor-unit voltage detector 17a and capacitor-unit current detector 17b, which detect the voltage and the current, respectively, of capacitor unit 11. Vehicle power supply device 3 further includes temperature sensor 18 in the vicinity of capacitor unit 11 so as to detect the temperature of the area. Temperature sensor 18 is formed of a thermistor, which is highly temperature-sensitive and easy to form a detection circuit.

Microcomputer 15 is electrically connected to battery voltage detector 10, charge circuit 13, discharge circuit 14, switch 16, capacitor-unit voltage detector 17a, capacitor-unit current detector 17b, and temperature sensor 18.

In FIG. 1, switch 16 is connected to battery voltage detector 10, but receives instructions from microcomputer 15 via battery voltage detector 10. Therefore, switch 16 is connected to microcomputer 15 electrically.

The following is a description of the operation of vehicle power supply device 3.

First, ignition switch 2 is turned on to start the operation of the vehicle. As a result, battery 1 supplies power to microcomputer 15 via IG terminal 4.

Battery 1 supplies another power at a voltage of 12V to vehicle power supply device 3 via +BC terminal 5. Battery 1 supplies further another power to electronic controller 6 via power supply terminal 7.

Next, microcomputer 15 controls charge circuit 13, so that battery 1 charges capacitor unit 11. The voltage of battery 1 is determined to be normal when it is at the standard value (for example, 9.5V) or more. In other words, no auxiliary power is necessary because the braking of the vehicle is performed normally by the power supplied from battery 1 to power-supply terminal 7.

Later, when ignition switch 2 is turned off to terminate the operation of the vehicle, IG terminal 4 is turned off, and vehicle power supply device 3 places its operating condition in an off mode. At the same time, microcomputer 15 controls discharge circuit 14, so that capacitor unit 11 discharges the auxiliary power accumulated therein. This extends the life of the capacitors.

The following is a description of the operation of vehicle power supply device 3 when battery 1 either has a voltage drop or is under abnormal conditions.

When the voltage detected by battery voltage detector 10 while the vehicle is in use becomes below the standard value (9.5V), microcomputer 15 determines that battery 1 is at an abnormal voltage. As a result, microcomputer 15 turns on switch 16, which is normally in the off state, so as to supply auxiliary power from capacitor unit 11 to electronic controller 6 via OUT terminal 12. Microcomputer 15 also transmits an abnormality signal indicating abnormality of battery 1 to communication output terminal 9. Electronic controller 6 makes the abnormality of battery 1, for example, be displayed in the vehicle, thereby directing the driver to immediately stop the vehicle. At the same time, the auxiliary power accumulated in capacitor unit 11 is supplied to electronic controller 6. This enables the driver to apply brakes to stop the vehicle safely.

When an abnormality of capacitor unit 11 is detected by capacitor-unit voltage detector 17a while the vehicle is in use, microcomputer 15 transmits an abnormality signal indicating abnormality of capacitor unit 11 to electronic controller 6 via communication output terminal 9. This allows the driver to have a maintenance company or the like inspect or replace capacitor unit 11.

Capacitor unit 11 can itself detect sudden abnormalities due to a short-circuit or disconnection of the capacitors by making capacitor voltage detector 17a monitor the voltage.

Figure 2:
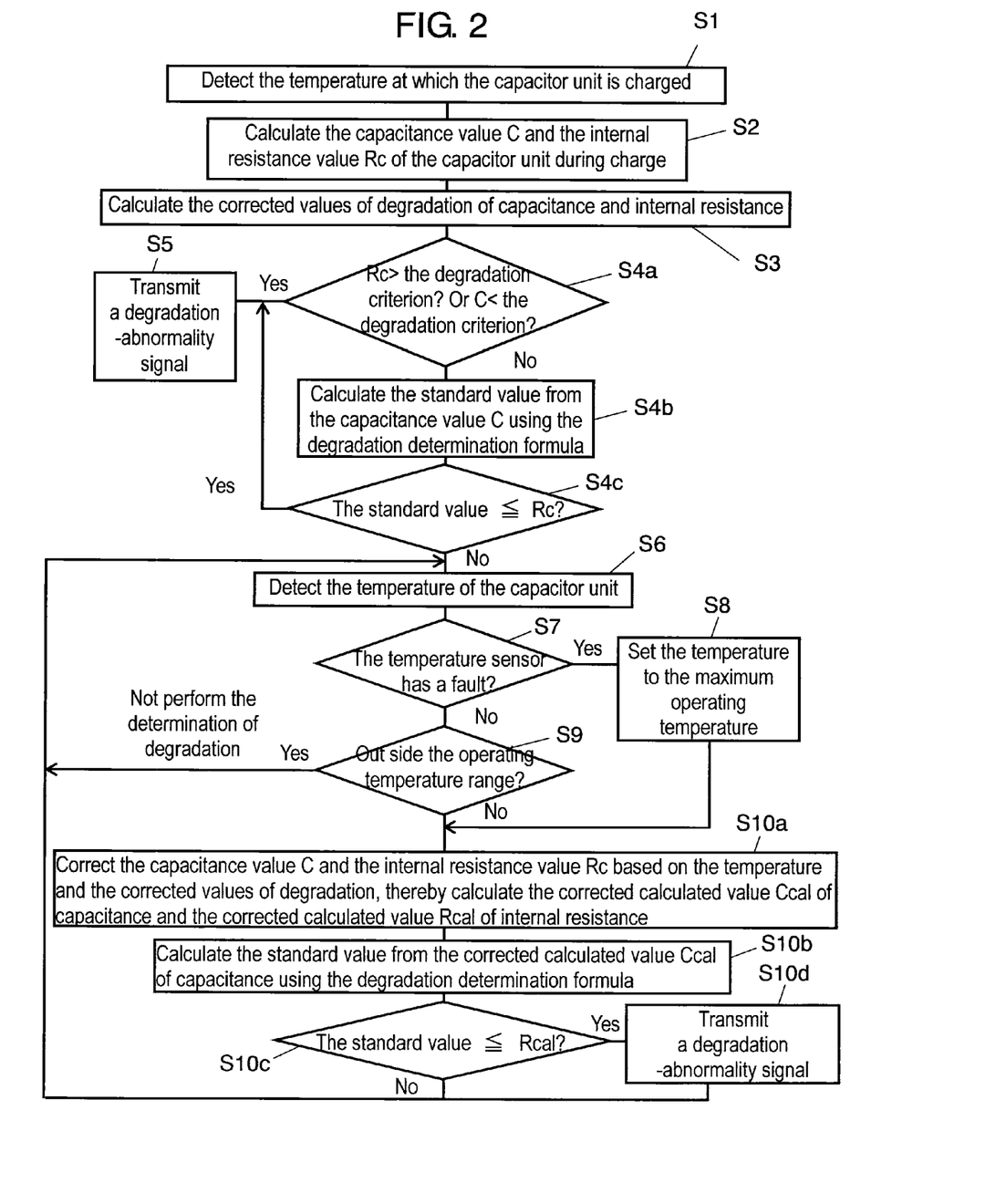
FIG. 2 is a flowchart showing the operation flow of the vehicle power supply device of the embodiment of the present invention.

The following is a description, with reference to FIG. 2, of the basic operation of a method for detecting a slowly progressive abnormality caused by degradation of the capacitors.

FIG. 2 is a flowchart showing the operation flow of the vehicle power supply device of the embodiment of the present invention.

First of all, when the vehicle is started, capacitor unit 11 is charged with electric charges as auxiliary power. Temperature sensor 18 detects the temperature at this moment (S1).

When charging is started, capacitor-unit voltage detector 17a starts the detection of the voltage of capacitor unit 11 with time. At the same time, capacitor-unit current detector 17b starts the detection of the charging current of capacitor unit 11 with time. From the detected current and voltage, a capacitance value C and an internal resistance value Rc of capacitor unit 11 are obtained (S2) as follows.

Figure 3:
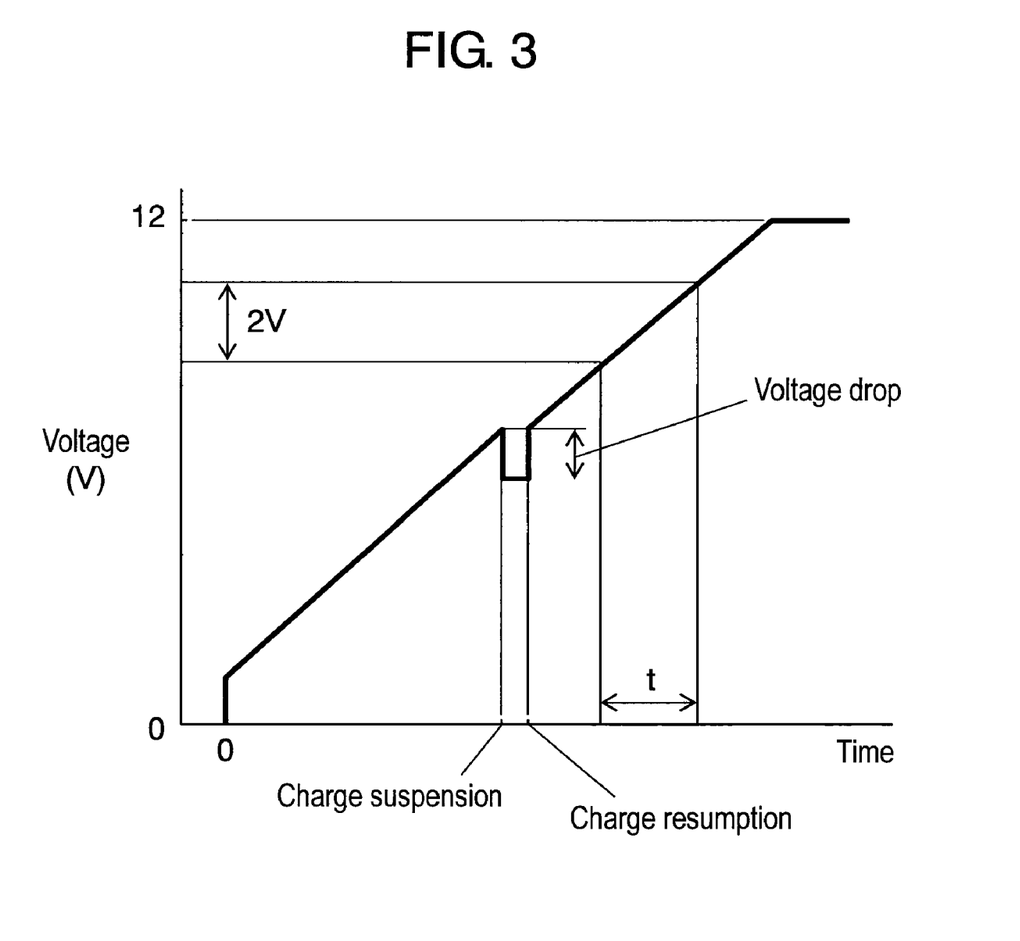
FIG. 3 is a graph showing the change in the voltage of a capacitor unit with time during charge in the vehicle power supply device according to the embodiment of the present invention.

FIG. 3 is a graph showing the change in the voltage of the capacitor unit with time during charge in the vehicle power supply device according to the embodiment of the present invention. In FIG. 3, the horizontal axis represents time and the vertical axis represents voltage.

After the charging is started, electric charges accumulate with time in capacitor unit 11 so as to increase the voltage of capacitor unit 11. While the voltage is increasing, the charging is suspended so that the voltage of capacitor unit 11 changes and drops only by the internal resistance. Later, the charging is resumed. Capacitor-unit voltage detector 17a detects the voltage drop by utilizing the fact that the charge voltage changes before and after the suspension of the charging. The voltage drop and the current value, which is detected by capacitor-unit current detector 17b during charge, are substituted into a resistance value calculation formula (the former is divided by the latter), thereby obtaining the internal resistance value of capacitor unit 11. Alternatively, the internal resistance value can be obtained from the voltage rise before and after the resumption of the charging.

Suspending the charging in this manner provides an accurate internal resistance value.

After the charging is resumed, capacitor voltage detector 17a detects the charge voltage change rate (shown by inclination in FIG. 3) by the end of the charging period. The charge voltage change rate is determined by detecting time t required for the charge voltage of capacitor unit 11 to achieve a predetermined voltage difference (2V in the embodiment).

In the embodiment using an AD converter, the accuracy of the charge voltage change rate is enhanced by detecting the time required to achieve the predetermined voltage difference of 2V, which is large enough to be detected with sufficient accuracy. The time detection is more accurate by about an order of magnitude than the voltage detection by the AD converter, so that the charge voltage change rate can be determined more accurate by an order of magnitude than ever.

The time thus required to obtain the difference of 2V is multiplied by the charging current obtained from the output of capacitor-unit current detector 17b, and the product is divided by the predetermined voltage (2V) to obtain the capacitance value C.

The charging process is ended when the output of capacitor voltage detector 17a reaches 12V, which is the charge end voltage.

In the embodiment, capacitor unit 11 has an internal resistance of 130 mO and a capacitance of 10 F at a temperature of 0° C.

After the charging process is ended, the internal resistance value and the capacitance value cannot be detected in the above-described manner and therefore are estimated from the temperature of capacitor unit 11 based on their values obtained during charge as follows.

Figure 4A:
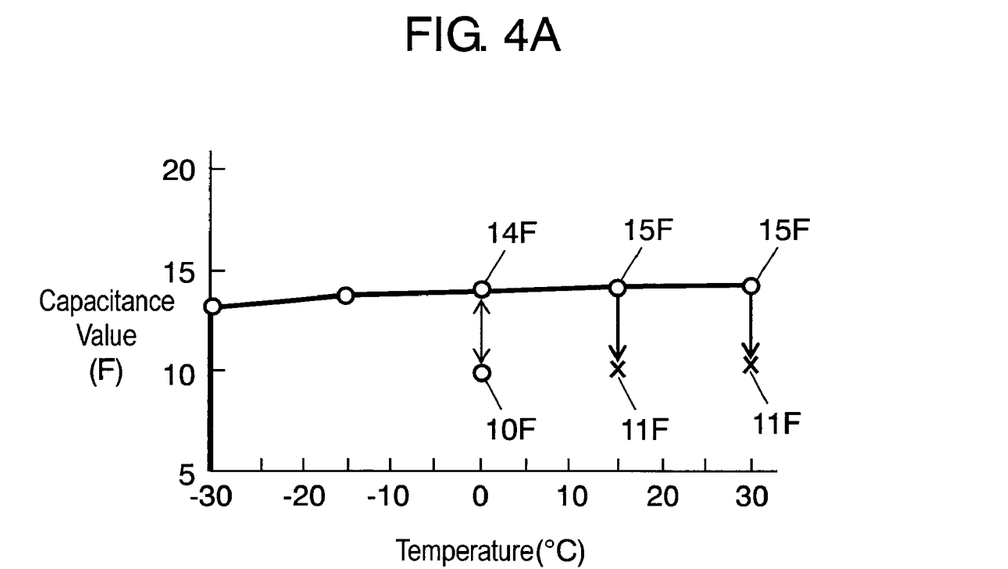
FIG. 4A is a graph showing the change in the capacitance of the capacitor unit with temperature in the vehicle power supply device according to the embodiment of the present invention.

FIG. 4A is a graph showing the change in the capacitance of the capacitor unit with temperature in the vehicle power supply device according to the embodiment of the present invention. In FIG. 4A, the capacitance value is the average value of a large number of brand-new capacitor units 11. Therefore, the capacitance value of any brand-new unit 11 is close to the value on the temperature characteristic line of FIG. 4A. The capacitance value, however, gradually decreases as capacitor unit 11 is degraded with time during use. As a result, for example, the capacitance value of 10 F obtained at 0° C. in the embodiment is lower by 4 F than the capacitance value 14 F of brand new capacitor unit 11. This indicates that capacitor unit 11 has been degraded by 4 F from the brand-new condition. When measured at other temperatures, the capacitance value of the currently-used capacitor unit 11 is always different by 4 F from the capacitance value of brand new capacitor unit 11 as shown in FIG. 4A.

Thus, the current capacitance value can be estimated from the capacitance value obtained in S2 in the flowchart of FIG. 2 and the characteristic graph of FIG. 4A. This is because the difference in the capacitance between the currently-used capacitor unit 11 and the brand-new capacitor unit 11 is constant at 4 F regardless of the temperature.

When the current temperature is, for example, 15° C., the capacitance value of the brand-new capacitor unit 11 at 15° C. is obtained from FIG. 4A (15 F in this case). Then, the difference 4 F between the currently-used capacitor unit 11 and the brand-new capacitor unit 11 is subtracted from the obtained capacitance value so as to estimate that the actual capacitance value is 11 F.

The capacitance of capacitor unit 11 at any temperature can be estimated in this manner only from the temperature at that moment. The difference (4 F in the embodiment) in the capacitance between the currently-used capacitor unit 11 and the brand-new capacitor unit 11 is defined as a corrected value of degradation, which is obtained in S3 in the flowchart of FIG. 2.

Similarly, the internal resistance is estimated only by the temperature.

Figure 4B:
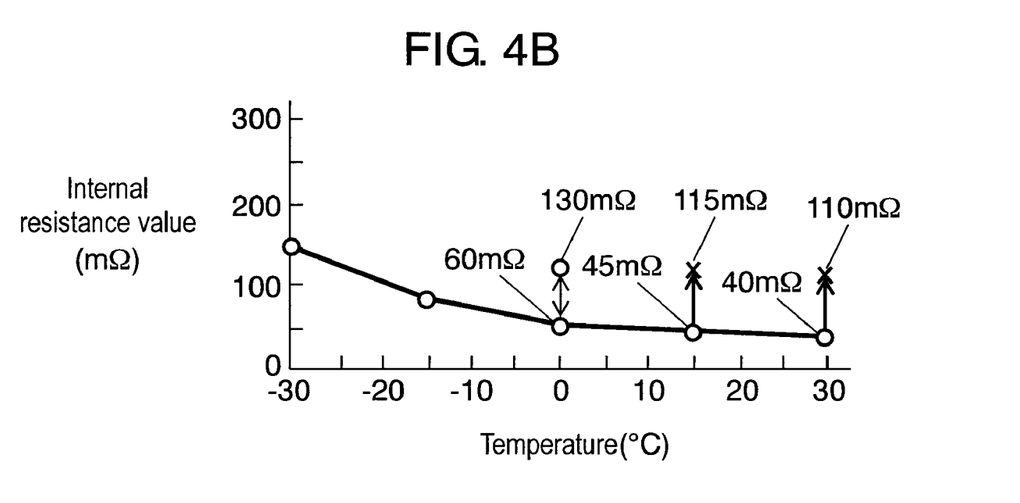
FIG. 4B is a graph showing the change in the internal resistance of the capacitor unit with temperature in the vehicle power supply device according to the embodiment of the present invention.

FIG. 4B is a graph showing the change in the internal resistance of the capacitor unit with temperature in the vehicle power supply device according to the embodiment of the present invention. In FIG. 4B, when the internal resistance at 0° C. is 130 mO, the average internal resistance of brand-new capacitor units 11 is 60 mO. This indicates that the currently-used capacitor unit 11 has been degraded from the condition of the brand-new capacitor unit 11 by the difference between them (the corrected value of degradation), which is 70 mO.

This value is also obtained in S3 as the corrected value of degradation of internal resistance from the internal resistance value obtained in S2 in the flowchart of FIG. 2 and from FIG. 4B.

When at least one of the capacitance value C and the internal resistance value Rc obtained in S2 does not satisfy a pre-calculated degradation criterion of capacitor unit 11 (C is smaller than the degradation criterion, or Rc is larger than the degradation criterion) ("Yes" in S4a), microcomputer 15 determines that capacitor unit 11 is degraded. Microcomputer 15 then transmits a degradation-abnormality signal indicating the fact to electronic controller 6 via communication output terminal 9 (S5).

When "No" in S4a, on the other hand, the standard value corresponding to the current temperature is calculated by substituting the capacitance value C obtained in S2 into a degradation determination formula (which is later described in detail) corresponding to the temperature detected in S1 (S4b).

When the standard value thus calculated is equal to or less than the internal resistance value Rc, microcomputer 15 determines that the capacitor unit is degraded ("Yes" in S4c) and the process goes to S5.

Thus, the capacitor unit can be determined whether it is degraded or not by using the degradation determination formula when it is activated. This determination is more accurate than the conventional method of using finite pieces of degradation standard value data.

When "No" in S4c, the degradation of the capacitor unit while the vehicle is in use is checked with time. Such a periodical determination of degradation improves its accuracy. In this case, the internal resistance and the capacitance are estimated as follows based on the current temperature.

First, the ambient temperature of capacitor unit 11 is detected (S6).

When temperature sensor 18 has a fault such as disconnection or short-circuit ("Yes" in S7), the temperature is unknown and therefore the current temperature is set to the maximum operating temperature of capacitor unit 11 (S8). Since then, the degradation of capacitor unit 11 is determined by calculating a later-described corrected calculated value of internal resistance based on the maximum operating temperature.

The current temperature is set to the maximum operating temperature (30° C. in the embodiment) of capacitor unit 11 when temperature sensor 18 has a fault because as apparent from FIG. 7, the higher the operating temperature of capacitor unit 11, the more severe the degradation standard value in the embodiment.

The use of the temperature having the most severe load conditions when the correct temperature is unknown reduces the risk of compromising the accuracy of the determination of degradation of capacitor unit 11 (the risk of capacitor unit 11 being erroneously determined to be normal when it is actually degraded).

When temperature sensor 18 operates normally ("No" in S7) and the current temperature is outside the operating temperature range (−30° C. to 30° C. in the embodiment) of capacitor unit 11 ("Yes" in S9), the determination of degradation of unit 11 is not performed.

This is because temperature sensor 18, which is formed of a thermistor, may have an extreme sensitivity such as too high or too low when used outside the operating temperature range, thereby decreasing its accuracy of temperature detection. Moreover, the ability of capacitor unit 11 as the auxiliary power supply cannot be fully guaranteed.

For this reason, the determination of degradation of capacitor unit 11 is not performed until the temperature of vehicle power supply device 3 is brought into the operating temperature range.

When "No" both in S7 and S9, estimated corrected values of the capacitance and the internal resistance of the current capacitor unit 11 are calculated from the corrected values of degradation (4 F and 70 mO, respectively, in the embodiment) obtained in S3 and the temperature detected in S6 using the characteristic graphs of FIGS. 4A and 4B (S10a). More specifically, first, the capacitance and the internal resistance which correspond to the detected temperature are calculated using the characteristic graphs of FIGS. 4A and 4B, respectively.

Next, the corrected value of degradation of capacitance is subtracted from the capacitance value to obtain a corrected calculated value Ccal of capacitance. On the other hand, the corrected value of degradation of internal resistance is added to the internal resistance value to obtain a corrected calculated value Rcal of internal resistance.

Next, the corrected calculated value Ccal of capacitance is substituted into a later-described degradation determination formula of capacitor unit 11 to calculate the standard value (S10b).

Figure 5:
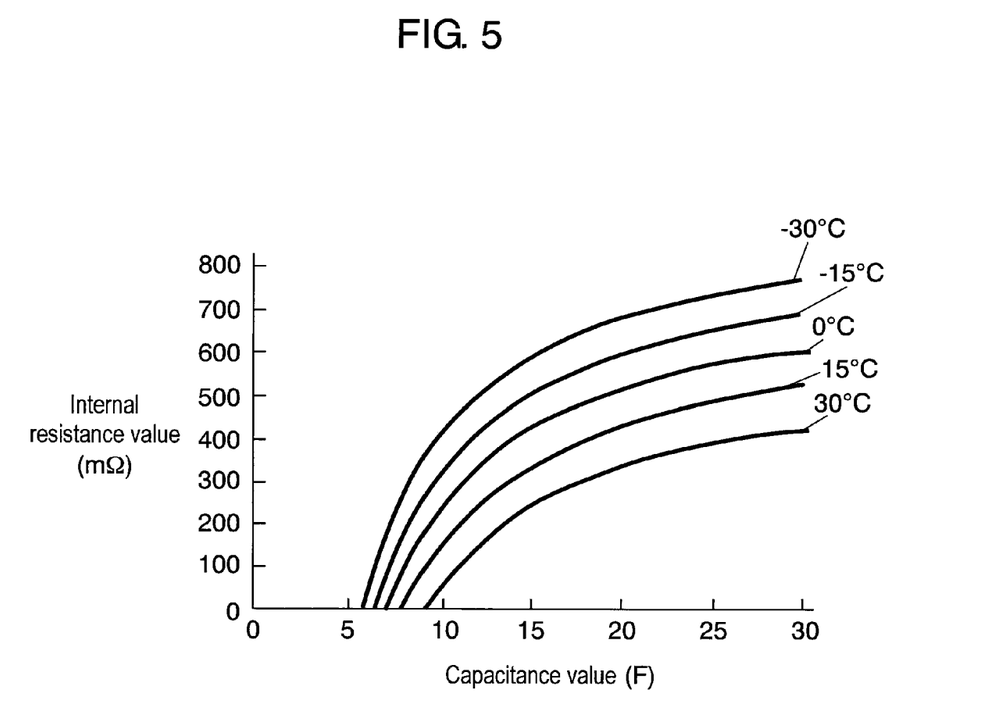
FIG. 5 is a correlation graph between the capacitance and the degradation standard value of the internal resistance in the vehicle power supply device according to the embodiment of the present invention, using degradation determination formulas corresponding to different temperatures.

FIG. 5 is a correlation graph between the capacitance and the degradation standard value of the internal resistance in the vehicle power supply device according to the embodiment of the present invention, using degradation determination formulas corresponding to different temperatures. In the correlation graph, the horizontal axis represents the capacitance and the vertical axis represents the internal resistance as the standard value.

In FIG. 5, when the standard value corresponding to the current temperature is equal to or less than the corrected calculated value Rcal of internal resistance, capacitor unit 11 is determined to be degraded ("Yes" in S10c), and the degradation-abnormality signal is transmitted in the same manner as in S5 (S10d).

Then, the process returns to S6 regardless of the presence or absence of degradation so as to repeat the same processes to perform the determination of degradation at the predetermined time interval.

Figure 6:
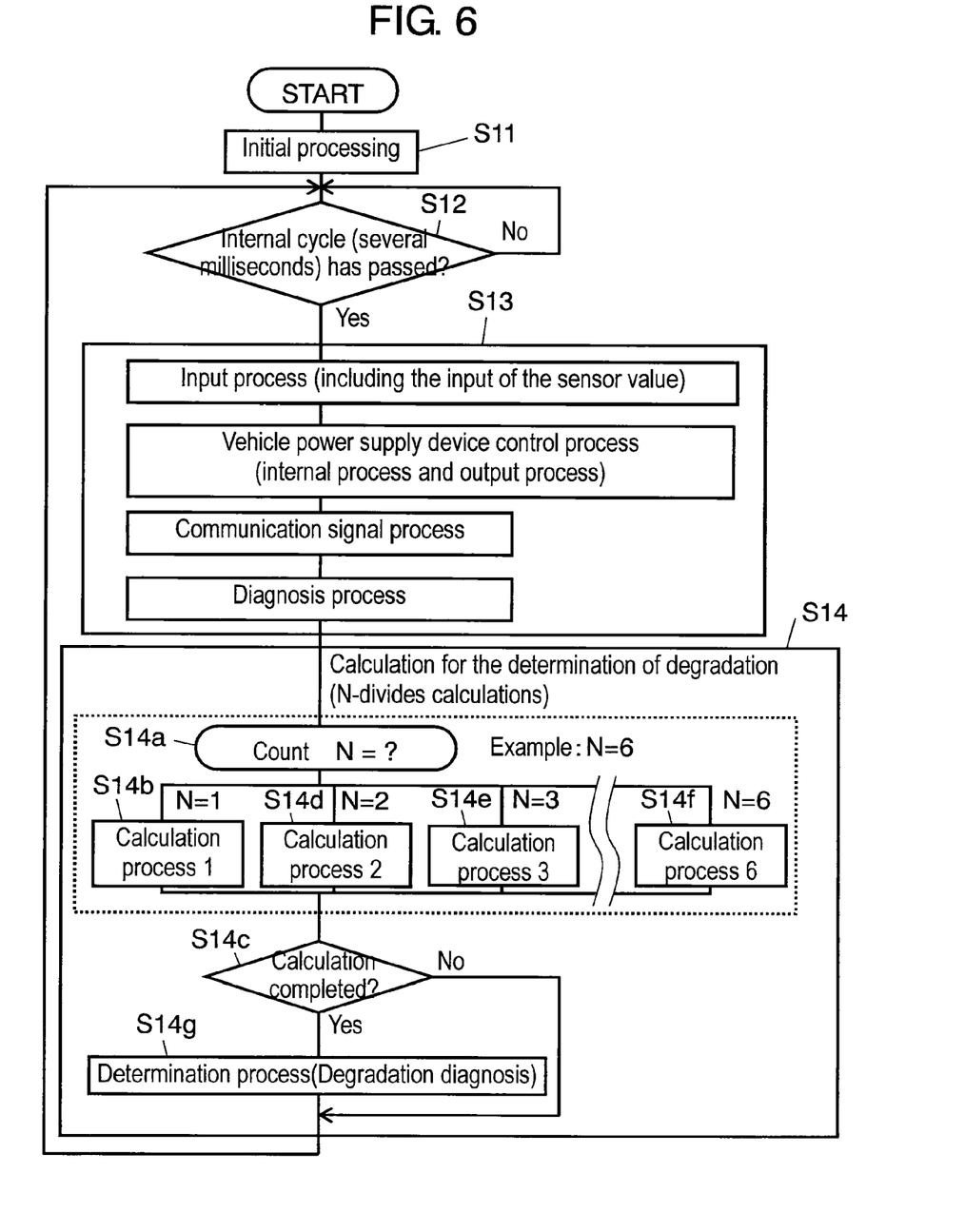
FIG. 6 is a flowchart showing the timing control by a microcomputer in the vehicle power supply device according to the embodiment of the present invention.

The following is a description of the specific processes of the timing control by the microcomputer with reference to the flowchart of FIG. 6.

FIG. 6 is a flowchart showing the timing control by a microcomputer in the vehicle power supply device according to the embodiment of the present invention.

In general, the execution of the main program of a microcomputer is repeated in a specific internal cycle (in the order of several milliseconds, and 6 milliseconds in the embodiment). Under the timing control by the microcomputer, if an event or circumstance occurs in a cycle, the microcomputer performs the necessary processing and waits for the next cycle.

Therefore, the processes shown in FIG. 2 are sequentially performed in the internal cycle.

More specifically, in FIG. 6, first of all, when ignition switch 2 is turned on to supply power to microcomputer 15, initial processing is performed (S11).

Next, it is determined whether the predetermined internal cycle has passed or not when electronic controller 6 transmits or receives a signal to or from microcomputer 15 (S12). When the time period corresponding to the internal cycle has not passed (No" in S12), the process returns to S12 to wait for the internal cycle to pass.

When the internal cycle has passed ("Yes" in S1), various processing routines including a communication signal process and a diagnosis process are sequentially executed in addition to the input process and the vehicle power supply device control process shown in FIG. 2 (S13).

Next, calculations (S10a to S10d in FIG. 2) for the determination of degradation are performed in S14. The calculation process is described in detail as follows.

Assume that the voltage of battery 1 becomes lower than the specified voltage (9.5V) and that the driver brakes the vehicle by the operation of vehicle power supply device 3.

Also assume that the voltage of unit 11, which is Vstr before vehicle power supply device 3 is started becomes Vend after vehicle power supply device 3 is started as a result that a constant load current Icnt flows from capacitor unit 11 during the period of time t. In this case, the load requires Vend to be equal to or more than a minimum voltage Vmin and hence to satisfy formula (1) below.

$$Vend \geq Vmin \quad (1)$$

On the other hand, the voltage drop $\Delta V$ of capacitor unit 11 is expressed by formula (2) below:

$$\Delta V = Vstr - Vend \quad (2)$$

When formula (1) is substituted into formula (2), the following formula (3) is obtained:

$$\Delta V \leq Vstr - Vmin \quad (3)$$

The voltage drop $\Delta V$ is expressed as the sum of the voltage drops caused by the wiring system and the internal resistance of the capacitors as well as by the braking of the vehicle.

A voltage drop Vload caused by the braking of the vehicle is expressed by the following formula:

$$Q = C \times Vload \therefore Vload = Q/C \quad (4)$$

where Q is an electric charge amount and C is the capacitance value of capacitor unit 11

In formula (4), the electric charge amount Q is consumed by the braking of the vehicle and can be expressed as formula (5) below:

$$Q = Icnt \times t \quad (5)$$

Formula (5) is substituted into formula (4) to obtain formula (6) below:

$$Vload = (Icnt \times t)/C \quad (6)$$

A voltage drop Vdr caused by the wiring system is expressed by formula (7) below:

$$Vdr = Vf + (Rloss \times Icnt) \quad (7)$$

where Vf is a constant voltage drop showing a weak current dependence like a diode, and Rloss is a total of the resistance value of the wiring system and the resistance values of switching elements.

A voltage drop Vc caused by the internal resistance of the capacitors is expressed by formula (8) below:

$$Vc = Rc \times Icnt \quad (8)$$

where Rc is the internal resistance value of capacitor unit 11

Through these formulas, the voltage drop $\Delta V$ of capacitor unit 11 as a whole is expressed by formula (9) below:

$$\Delta V = Vc + Vload + Vdr \quad (9)$$
$$= Rc \times Icnt + (Icnt \times t)/C + Vdr$$

Formula (9) can be substituted into formula (3) to be expressed in formula (10) below:

$$(Vstr - Vmin) \geq Rc \times Icnt + (Icnt \times t)/C + Vdr \quad (10)$$

Formula (10) can be converted to formula (11) below:

$$Rc \leq ((Vstr - Vmin) - Vdr - (Icnt \times t)/C)/Icnt \quad (11)$$

In formula (11), when the temperature is kept constant, Vstr, Vmin, Vdr, Icnt, and t are all kept constant. Consequently, formula (11) can be expressed by formula (12) below:

$$Rc \leq A - B/C \quad (12)$$

where A and B are constant coefficients.

Formula (12) provides the relational expression of the capacitance value C and the internal resistance value Rc of capacitor unit 11 to meet the load. In other words, in theory, C and Rc need to satisfy formula (12).

Formula (12) can be used to determine whether capacitor unit 11 is degraded or not as follows. For example, C is substituted into formula (12) in S4b of FIG. 2. When Rc meets formula (12), that is, when Rc is equal to or less than the standard value, capacitor unit 11 is determined to be normal. The standard value is the result of the right-hand side of formula (12). When Rc does not meet formula (12), capacitor unit 11 is determined to be degraded.

Similarly, in S10a of FIG. 2, the corrected calculated values Ccal, Rcal of C and Rc are calculated, and the corrected calculated value Ccal is substituted into formula (12) (S10b). When Rcal satisfies formula (12), that is, when Rcal is equal to or less than the standard value, capacitor unit 11 is determined to be normal. The standard value is the result of the right-hand side of formula (12). When Rcal does not satisfy formula (12), capacitor unit 11 is determined to be degraded.

From the aforementioned calculations, the degradation determination formula of capacitor unit 11 is obtained.

In practice, the constants A and B are set so that capacitor unit 11 is more likely to be determined to be degraded by considering margins, for example, for measurement errors of Rc and C of capacitor unit 11. More specifically, the internal resistance value Rc is given a 20% margin, and the capacitance value C is given a 15% margin. Consequently, the following formula is obtained:

$$Rc \leq 0.8 \times (A - (B/C) \times 1.15) \leq A' - B'/C \quad (13)$$

where A' and B' are constants after the margins are added

The constants A' and B', which change with temperature (temperature coefficients), are stored in the ROM in association with each temperature. The data is much smaller than the conventional degradation standard value data shown in FIG. 7, and therefore, can be stored in the ROM without increasing the storage capacity than the conventional data.

Formula (13) (the degradation determination formula) is depicted as shown in FIG. 5 using A' and B' at each temperature. The graph makes it possible to accurately determine the degradation limit of internal resistance (standard value) with respect to a given capacitance value at a given temperature and hence to improve the accuracy of the determination of degradation.

The following is a method for actually determining degradation under the control of the microcomputer shown in the flowchart of FIG. 6 using the aforementioned calculations.

After the various processing routines (S13) are executed, the determination of degradation is performed using the corrected calculated values Ccal and Rcal of the capacitance value C and the internal resistance value Rc.

The degradation can be readily determined by comparing between the standard value obtained by substituting the corrected calculated value Ccal of capacitance into formula (13) and the corrected calculated value Rcal of internal resistance. In the actual calculation, however, it is necessary to calculate the inverse (division) of Ccal. The microcomputer is a general-purpose 8-bit microcomputer because of cost limitations, so that the execution of division is time-consuming.

In particular, highly accurate determination of degradation is required to increase the number of significant digits for division. However, when division is executed by extending the calculation of a microcomputer to double precision, that is, 16 bits (1 word), it is very time-consuming to prepare and execute a division algorithm between two sets of 1 word data. On the other hand, a microcomputer is required to generate data at the timing determined by the internal cycle so as, for example, to allow a vehicle power supply device to communicate with the electronic controller (computer) for braking the vehicle so as to perform data exchange.

Therefore, the high-precision calculation (in particular, the division between two sets of 1 word data) of formula (13) would not end within the internal cycle, thereby affecting the control cycle and generating data at the wrong timing.

To avoid this, a program is prepared in which the division of formula (13) is divided into parts that can each be calculated in the internal cycle and the parts are calculated sequentially. This method is described as follows using the flowchart (S14) of FIG. 6.

First of all, the calculation is divided into six in the embodiment. The calculation of formula (13) including the high-precision division between two sets of 1 word data is complete by executing the six division routines sequentially as follows.

First, the calculation to be performed is determined by the value of count N (S14a).

When N=1, the first divided calculation process 1 is executed (S14b). In calculation process 1, constants A' and B', which are required to calculate formula (13), are read from the ROM according to the temperature.

Then, the count N is incremented (added with 1) so as to determine whether the calculation is complete or not (S14c). When the calculation is incomplete, that is, when N is not 6 ("No" in S14c), the process returns to (S12) to wait for the internal cycle to pass.

In the same manner, when the count N is 2 in S14a, the second divided calculation process 2 is executed (S14d). The first ¼, for example, of the algorithm to calculate B'/C of formula (13) between two sets of 1 word data is executed.

Then, the count N is incremented so as to determine whether the calculation is complete or not in S14c. Since the calculation is not complete in this case ("No" in S14c), the process returns to S12.

In this manner, calculation process 3 (S14e) and the subsequent calculation processes are performed sequentially in accordance with the count N.

Finally, when the count N is 6 in S14a, the final calculation process 6 is executed (S14f). The calculation of, for example, B'/C is complete in calculation process 5 (unillustrated), so that A'−B'/C is calculated. As a result, the calculated value or standard value of internal resistance is obtained.

Dividing the calculation in this manner allows each calculation to be completed in the internal cycle, thereby generating data at the timing determined by the internal cycle.

When the calculation is complete ("Yes" in S14c), the obtained standard value is compared with the corrected calculated value of Rc so as to perform the determination of degradation (S14g). In other words, when the standard value obtained by the calculation is equal to or less than the internal resistance value Rcal, capacitor unit 11 is determined to be degraded (degradation diagnosis process). Then, the process returns to S12.

The aforementioned processes are repeated to determine degradation of capacitor unit 11.

The embodiment has shown an example in which the calculation of formula (13) is divided and executed according to the internal control cycle of microcomputer 15. Besides this, other calculations (such as the correction calculation of C or Rc with respect to the temperature) can be divided and executed in the same manner if they are time-consuming.

The above-described structure and operation enables vehicle power supply device 3 to achieve high-precision measurement and calculations without affecting the control cycle or the generated data when the degradation determination formula is calculated. This makes the determination of degradation of capacitor unit 11 more precise by at least an order of magnitude than the conventional method.

The capacitance value and the internal resistance value are calculated during charge in the embodiment. Alternatively, these values can be calculated and stored during discharge in the same manner when ignition switch 2 is turned off and the auxiliary power charged in capacitor unit 11 is discharged.

INDUSTRIAL APPLICABILITY

The vehicle power supply device of the present invention, which determines degradation of the capacitor unit with very high accuracy, is particularly useful as an emergency power supply used in an electronic brake system for electrically braking a vehicle.

The invention claimed is:

1. A vehicle power supply device comprising:
a capacitor unit including a plurality of capacitors storing auxiliary power;
a temperature sensor detecting a temperature of the capacitor unit;
a charge circuit charging the capacitor unit;
a capacitor-unit current detector detecting a current of the capacitor unit;
a capacitor-unit voltage detector detecting a voltage of the capacitor unit;
a switch being switched so as to make the capacitor unit output the auxiliary power when necessary; and
a controller electrically connected to the temperature sensor, the charge circuit, the capacitor-unit current detector, the capacitor-unit voltage detector, and the switch, wherein
the controller suspends and resumes a constant current charging or discharging or the capacitor unit so as to make the capacitor-unit voltage detector detect a change in a charge or discharge voltage of the capacitor unit before and after the constant current charging or discharging is resumed, thereby calculating an internal resistance value of the capacitor unit from the change detected by the capacitor-unit voltage detector and from an output of the capacitor-unit current detector;

the controller then calculates a capacitance value of the capacitor unit from a voltage change rate of the capacitor unit during charge or discharge and from the output of the capacitor-unit current detector; and the controller then calculates a standard value from the capacitance value using a degradation determination formula according to the temperature detected by the temperature sensor, and determines that the capacitor unit is degraded when the standard value is not more than the internal resistance value.

2. The vehicle power supply device of claim 1, wherein the voltage change rate during charge or discharge is determined by calculating a time period required to obtain a predetermined voltage difference of the capacitor unit.

3. The vehicle power supply device of claim 1, wherein the controller determines that the capacitor unit is degraded when at least a case happens, wherein the case is that the internal resistance value calculated during charge or discharge of the capacitor unit is bigger than a pre-calculated degradation criterion of the capacitor unit, or that the capacitance value calculated during charge or discharge of the capacitor unit is smaller than the pre-calculated degradation criterion of the capacitor unit.

4. The vehicle power supply device of claim 1, wherein the temperature sensor is a thermistor.

5. The vehicle power supply device of claim 1, wherein when an output f the temperature sensor exceeds an operating temperature range of the capacitor unit, the determination of degradation of the capacitor unit is not performed.

6. The vehicle power supply device of claim 1, wherein when the temperature sensor is disconnected or short-circuited, the determination of degradation of the capacitor unit is performed at a temperature having most severe load conditions in the operating temperature range of the capacitor unit.

7. The vehicle power supply device of claim 1, wherein the controller corrects the internal resistance value and the capacitance value at a predetermined time interval according to the temperature detected by the temperature sensor so as to calculate a corrected calculated value of internal resistance and a corrected calculated value of capacitance, thereby calculating the standard value from the corrected calculated value of capacitance using the degradation determination formula of the capacitor unit; and the controller divides and executes at least one of the calculations according to the internal control cycle, thereby determining that the capacitor unit is degraded when the standard value is not more tan the corrected calculated value of internal resistance.

* * * * *